United States Patent [19]

Steckler et al.

[11] Patent Number: 4,633,298

[45] Date of Patent: Dec. 30, 1986

[54] DIGITALLY CONTROLLED PHASE LOCKED LOOP SYSTEM HAVING COARSE AND FINE LOCKING MODES

[75] Inventors: Steven A. Steckler, Clark; Alvin R. Balaban, Lebanon, both of N.J.

[73] Assignee: RCA Corporation, Princeton, N.J.

[21] Appl. No.: 676,827

[22] Filed: Nov. 30, 1984

[51] Int. Cl.⁴ .................. H04N 9/64; H04N 9/66; H04N 11/04
[52] U.S. Cl. .................................. 358/25; 358/13; 358/19
[58] Field of Search .................. 358/13, 19, 25; 375/119

[56] References Cited

U.S. PATENT DOCUMENTS

| | | | |
|---|---|---|---|
| 4,122,487 | 10/1978 | Beaulier et al. | 358/13 |
| 4,280,099 | 7/1981 | Rattlingourd | 328/63 |
| 4,291,332 | 9/1981 | Kato et al. | 358/19 |
| 4,484,152 | 11/1984 | Lee | 331/1 A |

*Primary Examiner*—John W. Shepperd
*Attorney, Agent, or Firm*—E. M. Whitacre; P. J. Rasmussen; K. N. Nigon

[57] ABSTRACT

A phase detector included in a digital television receiver develops first and second phase error signals based on samples of the color reference burst signal taken from one and two horizontal lines respectively. The first phase error signal is used to attain coarse synchronization between a sampling clock signal and the burst signal. The second phase error signal is used to enhance synchronization accuracy after coarse synchronization has been attained.

10 Claims, 2 Drawing Figures

DIGITALLY CONTROLLED PHASE LOCKED LOOP SYSTEM HAVING COARSE AND FINE LOCKING MODES

This invention relates to apparatus for improving the accuracy of digitally controlled phase locked loop systems.

A phase locked loop (PLL) is used in a signal processing system to generate an oscillatory signal related in frequency and phase to a reference signal. Generally, a PLL includes a voltage controlled oscillator (VCO), a phase detector and a loop filter.

The VCO may be an oscillator which produces a signal, the frequency and phase of which may be changed in response to a control signal. This control signal is developed by the phase detector and the loop filter.

The phase detector compares the signal provided by the VCO to the reference signal and generates a signal that is proportional to the difference in phase between the two signals. Since the two signals may include undesirable noise components and since they may have different frequencies, the phase detector preferably averages the value of the phase difference between the two signals over several cycles.

The loop filter may be a low-pass filter which integrates the signal provided by the phase-error detector. The signal developed by the loop filter is applied as the control signal input to the VCO. Any difference in frequency or phase between the reference signal an the signal provided by the VCO results in a non-zero phase-error signal from the phase detector. The phase-error signals may be applied to the loop filter to increase or decrease the level of the signal applied to control the VCO. When the frequency and phase of the signal provided by the VCO correspond to the reference signal, the phase detector produces a zero-valued output signal and the signal produced by the loop-filter does not change. Consequently, the frequency of the signal provided by the VCO remains constant.

In a digital signal processing system, the signal provided by the PLL may be used to develop a clock signal which determines the rate at which the reference signal is sampled. To satisfy the Nyquist criteria, the frequency of the sampling clock signal may be chosen to be a multiple of the frequency of the reference signal. If the sampling clock signal is chosen to have a frequency four times the frequency of the reference signal, a simplified phase detector may be used.

The samples produced responsive to this clock signal may be represented by the sequence A sine $\theta$, A cosine $\theta$, $-$A sine $\theta$, $-$A cosine $\theta$, A sine $\theta$ ... etc., where A is proportional to the peak amplitude of the reference signal and $\theta$ approximates the phase angle which separates the reference signal and the signal which would be obtained by frequency dividing the sampling clock signal by four. The phase-error detector develops a phase-error signal from either the sine $\theta$ samples of the sequence or from a trigonometric function of both the sine $\theta$ and cosine $\theta$ samples of the sequence.

The quantization error inherent in digitally sampled data may complicate accurate phase locking by either of these methods. Generally stated, the problem occurs because analog to digital converters map analog values which differ by small amounts into the same digital value. So, phase errors which result in only small changes in the level of the analog signals may not be detectable.

For example, consider the PLL system used in a digital color television receiver. Composite video signals include a chrominance signal component composed of two quadrature phase related color difference signal components which amplitude and phase modulate a suppressed subcarrier signal. To simplify the extraction of the color difference signal information from the chrominance signal, the composite video signals also include a color synchronizing burst signal. This signal is eight to eleven cycles of the chrominance subcarrier signal included in the burst interval of each horizontal line of the composite video signal that contains image information.

The burst signal is used in digital color television receivers to synchronize the sampling clock signal. If the sampling clock signal is chosen to have a frequency of four times the frequency of the burst signal and if one phase of the sampling clock has a phase angle of $+33°$ with respect to the burst signal, the chrominance samples may be represented as interleaved samples of the two quadrature phase related color difference signals I and Q (i.e. as $+I$, $+Q$, $-I$, $-Q$, $+I$ ... etc. where the signs represent sampling phase and not necessarily sample polarity). However, if the phase difference between the sampling clock signal and the burst differs from 33°, the color difference signals obtained from the chrominance signal will produce color distortion when they are processed as I and Q color difference signals. Preferably, the phase of the sampling clock should vary by no more than five degrees with respect to the burst signal.

Because of the limited quantization resolution of the analog to digital converters which may be used in digital television receivers, phase accuracies of five degrees or less may be difficult to achieve. The amplitude of composite video signals normally ranges between $+100$ IRE for full brightness and $-40$ IRE for the tip of the horizontal sync pulse. This 140 IRE range may be digitized by a seven-bit analog to digital converter, having 128 discrete states. Consequently, the quantization level of the ADC is at least 1.1 IRE. It is desirable for a digital television receiver to handle weak as well as strong signals. In particular, chrominance components of the composite video signals that are attenuated by 18 dB relative to the nominal values presented above should still produce color images. When the burst signal, which has a nominal peak-to-peak amplitude of 40 IRE, is reduced by 18 dB, a 5 IRE peak-to-peak signal is obtained. Because the quantization level is 1.1 IRE, burst samples having amplitudes between $-0.55$ IRE and $+0.55$ IRE may not be distinguishable, since all of these values are quantized as a 0 digital codeword. Consequently, phase errors which produce analog values within this range may not be detectable. For example, a 10° phase error in the 5 IRE peak-to-peak signal described above produces a zero-crossing value of 0.44 IRE and a peak value of 2.46 IRE. When quantized, these values are represented by the digital codewords 0 and 2, the same codewords which represent the zero-crossing and peak values which are obtained when the sampling clock signal is exactly locked to the burst signal.

SUMMARY OF THE INVENTION

The present invention is embodied in a digitally controlled phase locked loop which includes a VCO for generating a sampling clock signal that corresponds in frequency and phase to a reference signal. Both the sampling clock signal and digitized samples of the reference signal are applied to a phase detector. The phase detector operates in two modes. In the first mode the phase detector generates phase error signals based on a first predetermined number of samples and in the second mode, on a second predetermined number of samples, being greater than the first predetermined number of samples. The phase detector includes apparatus to switch between the first and second modes based on the amplitudes of the phase-error signals. The phase error signals are coupled to the VCO to change the frequency and phase of the signal provided by the VCO to synchronize it to the reference signal.

DETAILED DESCRIPTION

Figure 1:
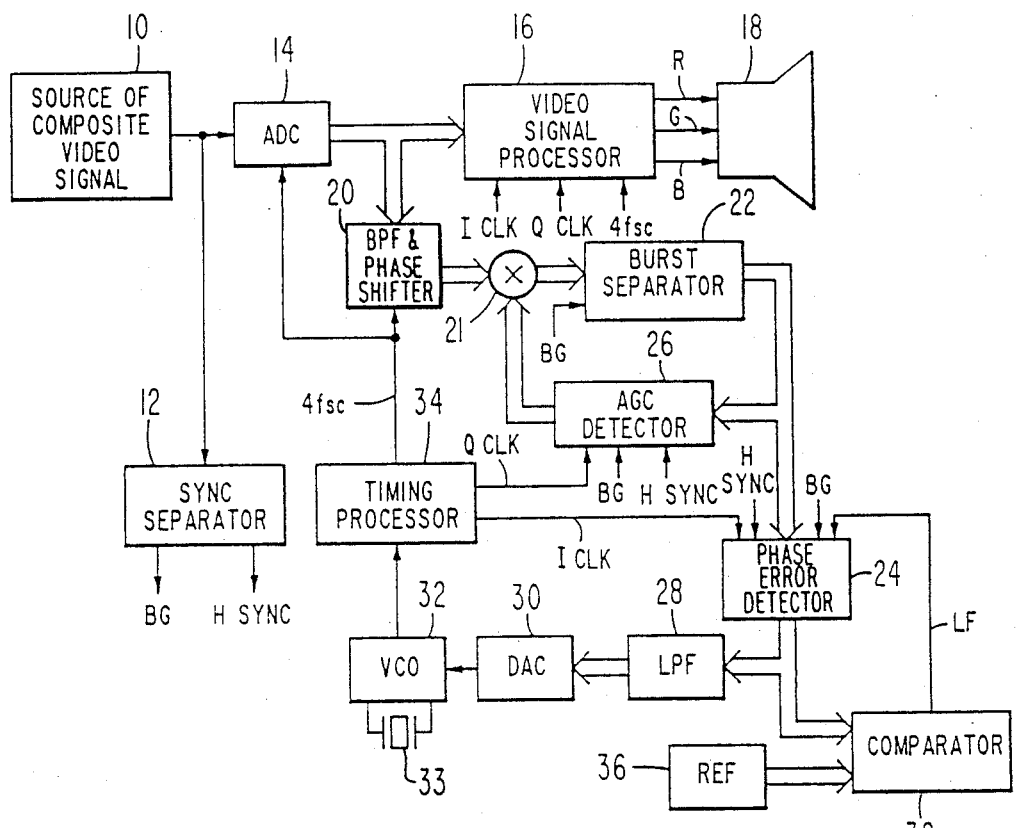
FIG. 1 is a block diagram of a phase locked loop system embodying the present invention in the environment of a digital television receiver.

In the drawings, broad arrows represent busses for multiple-bit parallel digital signals. Line arrows represent connections carrying analog signals or single bit digital signals. Depending on the processing speed of the devices, compensating delays may be required in certain of the signal paths. One skilled in the art of digital circuit design would know where such delays would be needed in a particular system.

In FIG. 1, a source of composite video signal 10, which may include the tuner, intermediate frequency amplifier and video detector of a conventional television receiver, applies base-band analog composite video signals to sync separator 12 and to analog to digital converter (ADC) 14. Sync separator 12 may be a conventional circuit which separates the horizontal synchronization pulses from an analog composite video signal and generates a burst gate signal, BG. The horizontal synchronization signal, H SYNC, provided by separator 12 is in a logic high state for the duration of each horizontal sync pulse and in a logic low state otherwise. The burst gate signal, BG, is in a logic high state during the burst interval of each horizontal line for four complete cycles of the burst signal and in a logic low state otherwise. These signals are used in the phase locked loop circuitry as explained below.

ADC 14, under control of a $4f_{sc}$ clock signal from timing processor 34, samples the analog composite video signal and produces digital samples representing the analog samples. ADC 14 may be a conventional flash ADC which provides, for example, seven-bit digital samples. These samples are applied to video signal processor 16. Processor 16 may, for example, separate the luminance components and the I and Q color difference signal components from the composite video samples, and process these components into primary color signals R, G and B which are applied to a display device 18. Video signal processor 16 is controlled by the clock signals $4f_{sc}$, I CLK and Q CLK. These signals are provided by timing processor 34, which is synchronized to the color burst reference component of the composite video signals by a phase-locked loop (PLL).

Composite video samples from ADC 14 are applied to band-pass filter and phase shifter 20. Band-pass filter and phase shifter 20 removes spurious high and low frequency noise components from the composite video samples and provides burst samples at its output port which are shifted in phase by 33° with respect to the burst samples applied to its input port.

Output samples from the filter and phase shifter 20 are applied to multiplier 21. Multiplier 21 scales the filtered samples by a factor determined by automatic gain control (AGC) detector 26. AGC detector 26 and multiplier 21 maintain the peak amplitude of the burst signal within a predetermined range of values. The multiplier 21 may be a conventional eight-bit by eight-bit multiplier, however, a simplified shift-and-add multiplier may be used instead.

Multiplier 21 applies the scaled and filtered samples to burst separator 22. In the present embodiment, burst separator 22, under control of the burst gate signal, BG, from sync separator 12, extracts samples representing four cycles of the burst signal from each line of the filtered samples.

Filtered, phase shifted and scaled samples from burst separator 22 are applied to phase error detector 24. Since the band-pass filter 20, used in this embodiment of the invention, shifts the phase of the NTSC burst signal by 33°, the zero-crossing points—which occurred at the R-Y phases of the unprocessed burst signal—occur at the I phases of the phase shifted burst signal.

Phase error detector 24 averages the magnitude of I phase samples of the burst signal (i.e. those occurring coincident with the leading edges of the I CLK pulses) to produce a phase error signal. This phase error signal is used to lock the clock signals provided by timing processor 34 to the phase shifted burst signal. Consequently, timing processor 34 produces clock signals that are aligned with the I and Q phases of the unfiltered composite video signals.

Figure 2:
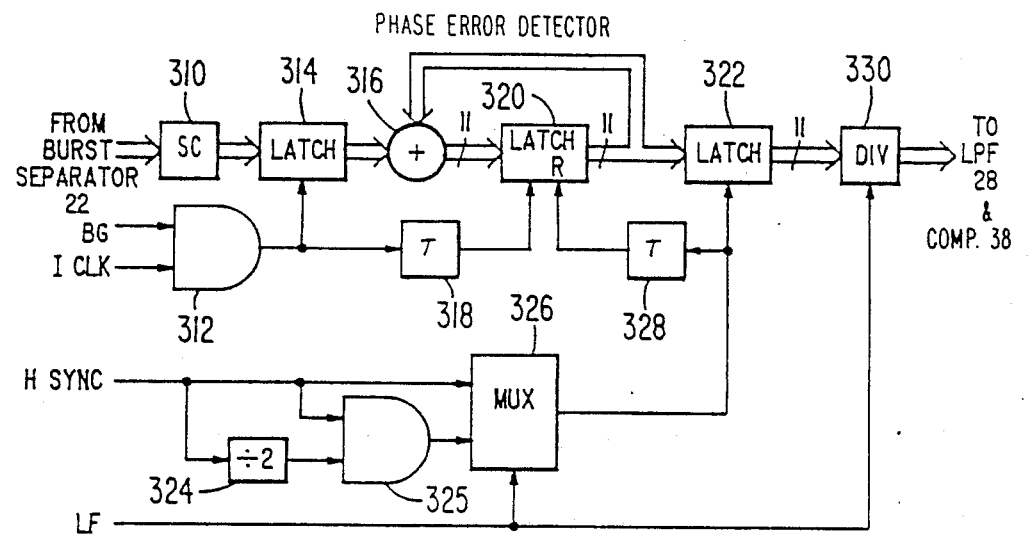
FIG. 2 is a block diagram of a phase detector suitable for use in the embodiment shown in FIG. 1.

FIG. 2 is the block diagram of a phase error detector suitable for use in the present invention. Digital samples from separator 22 are applied to selective complementer circuit 310. Circuit 310 changes the polarity of selected samples to apply single polarity burst samples to latch 314. Samples are loaded into latch 314 on the leading edges of the clock pulses applied to the latch by AND gate 312. The clock signal provided by gate 312 is the logical AND of the I clock signal, I CLK, and the burst gate signal, BG, provided respectively by timing processor 34 and sync separator 12. The codewords stored in latch 314 are samples of the burst signal taken at the phase angle of the I color difference signal but shifted through filter 20 to correspond to the zero-crossing points of the color burst signal.

These samples are applied to an accumulator which includes adder 316 and latch 320. Adder 316 sums seven-bit samples provided by latch 314 with eleven-bit samples provided by latch 320. The samples produced by adder 316 are stored in latch 320 coincident with the leading edges of the clock pulses provided to latch 320 by delay element 318. Delay element 318 provides the clock signal from AND gate 312, delayed to compensate for the processing time through adder 316. The samples stored in latch 320 represent the accumulated sum of eight or sixteen burst samples as explained below. To preserve sample accuracy and to prevent overflow errors, the samples are stored as eleven-bit values.

The accumulated samples are transferred from latch 320 to latch 322 on the leading edge of the clock signal applied to latch 322. This clock signal is developed from the horizontal sync signal H SYNC. H SYNC is applied to frequency divider 324 and to one data input terminal of multiplexer 326. Frequency divider 324, which may be a conventional divide by two circuit, provides a signal at one-half of the horizontal line frequency to one input terminal of AND gate 325. The H SYNC signal is applied to the second input terminal of AND gate 325. AND gate 325 produces a signal having a period equal to two horizontal line periods and a pulse width equal to that of the horizontal sync pulse. This signal is applied to the second data input terminal of multiplexer 326. The control signal to multiplexer 326, LF, is in a logic low state until the PLL locks to the burst frequency and then switches to a logic high state. Multiplexer 326 is configured to apply H SYNC as a clock signal to latch 322 when LF is in a logic low state and to apply the signal from AND gate 325 when LF is in a logic high state. Consequently, when the PLL is locking, the samples transferred to latch 322 represent the accumulated sum of eight zero-crossing burst samples (i.e. the zero-crossing samples of four cycles in one burst interval). After the PLL has locked onto the burst signal, however, the samples transferred from latch 320 to latch 322 represent the accumulated sum of sixteen samples (i.e. the zero-crossing samples from four cycles of each of two sequential burst intervals). Latch 322 provides these samples to divider 330 which divides the sample values by 8 or 16 under control of signal LF. Divider 330 may be a conventional programmable bit-shifter which shifts the eleven-bit samples rightward to less significant bit positions by three bits when LF is in a logic low state and by four bits when LF is in a logic high state. The circuitry which generates signal LF is described below in reference to FIG. 1.

To understand the operation of the phase error detector, assume that the signal produced by phase error detector controls a VCO to match the phase and frequency of the signal produced by the VCO to the color burst reference signal. For weak signals, the amplitude of the color burst signal may be as low as 5 IRE peak-to-peak, while the range of signals which must be handled by the ADC is 140 IRE. When these weak signal burst samples are digitized by a seven-bit ADC, the quantization error is approximately eleven percent of the peak-to-peak value. Consequently, a phase error detector similar to the one described above, but able to process only one line of samples, may be unable to achieve a phase accuracy of less than 10°. In addition, the phase of the signal produced by the VCO may jitter around the burst phase by ±10°.

To understand how this may occur, assume that the PLL has "locked" to the burst signal with a phase error of 10° per horizontal line. If the phase error for a particular line is 10°, the quantization error of the ADC may prevent the phase error detector from detecting the error, and no correction signal may be produced. Consequently, the phase error on the next subsequent line may be 20°. The phase error detector detects this error but it produces a correction signal proper for a phase error of 20° per line. This correction signal changes the phase error of the signal provided by the VCO from +10° per line to −10° per line. It can be demonstrated that a PLL using a phase error detector which averages samples from only one line may continue to jitter between phase errors of +10° and −10° per line.

In the present PLL system, however, when an apparent phase lock is achieved using the samples from one line, the phase error detector is switched to average samples from two sequential lines. In the example set forth above, the zero-valued samples from the line that has 10° phase error are averaged with the samples from the line that has a 20° phase error. This averaging produces a correction value that is appropriate for a 10° per line phase shift, exactly correcting the phase of the signal provided by the PLL. It can be shown that phase accuracies of less than ±5° can be achieved by averaging two lines of samples provided by a seven-bit ADC.

Although the present embodiment switches between averaging one and two lines of samples, it is contemplated that more lines of samples may also be averaged to achieve a more accurate lock. It is desirable, however, to average the samples from only one line to reach the initial locked state. This facilitates the correction of large phase errors (i.e. greater than 45° per line).

Referring again to FIG. 1, phase error detector 24 provides phase error samples to low-pass filter 28 at the horizontal line rate. Low-pass filter 28, which may include an integrator develops a signal proportional to the accumulated sum of the phase error signals provided by phase error detector 24. Filter 28 applies this signal to digital to analog converter (DAC) 30. DAC 30 changes the digital signal into an analog potential which is applied to VCO 32 to control the frequency of the signal provided by the VCO. VCO 32 may be a conventional voltage controlled oscillator which may have a free-running frequency that is determined by a piezo-electric crystal. Desirably, the resonant frequency of the crystal is close to $4f_{sc}$ (e.g. within 2 KHz of 14.31818 MHz for NTSC) to ensure that the PLL locks quickly and at the proper frequency.

VCO 32 applies a sinusoidal $4f_{sc}$ signal to timing processor 34. Processor 34 may include circuitry for generating a square wave $4f_{sc}$ clock signal from the sinusoidal input signal, and for generating the quadrature phase related I CLK and Q CLK signals, each of $2f_{sc}$. Details of processor 34 are not shown since it is not considered a part of the invention. Processor 34 may be built from conventional components by one skilled in the art.

As set forth above, the phase error detector 24 is switched between two modes. One mode averages the samples from each burst interval separately and uses the results to obtain a coarse lock to the burst frequency. The second mode averages the samples from two or more sequential burst intervals and uses the results to improve the accuracy of the coarse lock obtained in the first mode. Signal LF controls the switching between the two modes. Although the present embodiment shows a second mode which uses two sequential burst intervals to obtain a fine lock, it is contemplated that samples from two or more burst intervals each separated by one or more horizontal lines could also be used. When samples from non-adjacent lines are used, however, the divider 330 must be changed to divide the samples by a value that is a function of the number of horizontal lines separating the burst intervals as well as the number of accumulated samples.

Phase error detector 24 applies accumulated zero-crossing samples to one input terminal of the comparator 38 which produces the signal LF. A reference source 36 provides a value to the second input of comparator 38. The value provided by source 36 represents the value produced by the phase error detector when the PLL has achieved a coarse lock to the burst signal. The output signal of comparator 38, LF, is in a logic low state when the value applied by source 36 is less than the value provided by phase error detector 24 and in a logic high state otherwise. Accordingly, LF is in a logic low state until the PLL has achieved a coarse lock and in a logic high state until the values provided by phase error detector 24 indicate that the PLL is no longer synchronized to the burst signal.

The phase of the burst signal component of a composite video signal can change rapidly in response to changes in the source of broadcast signals. For example, a change between two programs may result in a change in the phase of the burst component of the composite video signal. Since the phase of the burst signal determines the hue of colors in the reproduced image, it is desirable for the PLL to be able to respond quickly to any change in the burst signal. To this end, the present PLL system includes an automatic gain control system comprising AGC detector 26 and multiplier 21. This AGC system maintains a desirable transient response characteristic for the PLL system.

AGC 26 develops a gain control signal from the samples which coincide with the Q clock signal. When the phase shifted samples that coincide with the I clock signal represent zero-crossing samples of the burst cycles, the samples that coincide with the Q clock represent the peaks of the burst cycles. AGC 26 averages these peak samples over one burst interval to produce a gain control signal which is applied to multiplier 21 to increase or decrease the magnitude of the filtered burst samples.

When the peaks of the phase shifted burst signal do not occur coincident with the Q clock pulses, the averaged peak value developed by AGC detector 26 may be less than the actual peak value of the burst. Moreover, for phase errors greater than 45°, the average value of the Q burst samples may be less than the average value of the I samples. In these instances, AGC detector 26 may apply a gain factor to multiplier 21 that is larger than would be applied if detector 26 averaged the actual peak values of the burst signal. Multiplier 21 scales all of the burst samples by this gain factor, including the I samples which are averaged by the phase detector 24 to develop the phase error signal. When the magnitude of the I samples is increased, the amplitude of the phase error signal provided by phase error detector 24 is increased, causing the frequency of signal provided by the VCO to change more quickly than if the magnitude of the I samples had not been increased. As the frequency of the signal provided by the VCO approaches a harmonic of the burst frequency, the value of the Q samples approach the peak value of the burst signal, and the gain factor developed by AGC detector 26 decreases, approaching its proper value. As the gain factor decreases and the PLL approaches a locked state, the magnitude of the I samples and the phase error signal developed from them decreases, slowing the rate at which the frequency of the signal provided by the VCO changes.

The rate at which the frequency of the signal provided by the VCO changes is proportional to the average value of the phase error between the individual cycles of the signal provided by the VCO and the burst signal. Consequently, the rate at which the loop approaches a locked state is generally higher than for a PLL without AGC circuitry or for a PLL having an AGC which determines the gain factor based on the values of both the zero-crossing and peak samples.

What is claimed is:

1. In a digital signal processing system including a source of sampling clock signal and a source of digital samples representing a color reference signal having a predetermined frequency and phase, a phase locked loop system including a phase detector comprising:

first means responsive to said sampling clock signal and to the digital samples representing said color reference signal and switchable between first and second operational modes for generating respective first and second phase error signals at an output terminal, said first and second phase error signals being generated from the values of respective first and second predetermined numbers of said digital samples; and second means coupled to said first means and responsive to the phase error signals provided at the output terminal of said first means for switching said first means between said first and second operational modes.

2. The phase detector set forth in claim 1 wherein:

said first means comprises an accumulator responsive to a control signal for summing said first predetermined number of digital samples when the control signal is in a first state and for summing said second predetermined number of digital samples when the control signal is in a second state; and said second means comprises:

a source of reference level signal; and a comparator for developing said control signal, being in said first state when the signal provided by said first means is greater than said reference signal and being in said second state otherwise.

3. In a digital signal processing system including a source of sampling clock signal and a source of digital samples representing a reference signal having a predetermined frequency and phase, a phase locked loop system comprising:

first means including an accumulator responsive to a control signal for summing a first predetermined number of said digital samples where the control signal is in a first state and for summing a second predetermined number of said digital samples when the control signal is in a second state;

a source of reference level signal; and a comparator for developing said control signal, being in said first state when the signal provided by said first means is greater than said reference signal and being in said second state when the signal provided by said first means is less than said reference signal.

4. The phase detector set forth in claim 3 wherein said first means further includes:

means responsive to said control signal for dividing said first phase error signal by said first predetermined number and for dividing said second phase error signal by said second predetermined number to provide first and second phase error signals proportional to the average value of said first and second predetermined numbers of digital samples respectively.

5. In a digital signal processing system including a source of analog color reference signal having a predetermined frequency and phase, a phase locked loop coupled to said source for developing a sampling clock signal having a frequency proportional to the frequency of said color reference signal and having a predetermined phase relationship with said color reference signal, said phase locked loop comprising:

sample providing means coupled to said source and responsive to said sampling clock signal for developing digital samples having values substantially equal to A sine r, A being a real number proportional to the amplitude of said reference signal and r being an angle proportional to the instantaneous difference in phase between said color reference signal and said sampling clock signal; and a phase detector comprising:

first means coupled to said sample providing means for generating a first phase error signal from a first predetermined number of said digital samples in a first operational mode and for generating a second phase error signal from a second predetermined number of said samples in a second operational mode; and second means coupled to said first means and responsive to the phase error signals provided at the output terminal of said first means for switching said first means between said first and second operational modes.

6. The phase detector set forth in claim 5 wherein:

said first means comprises an accumulator responsive to a control signal for summing said first predetermined number of digital samples when the control signal is in a first state and for summing said second predetermined number of digital samples when the control signal is in a second state; and said second means comprises:
a source of reference level signal; and
a comparator for developing said control signal, being in said first state when the signal provided by said first means is greater than said reference signal and being in said second state otherwise.

7. The phase detector set forth in claim 6 wherein said first means comprises:

means responsive to said control signal for dividing said first phase error signal by said first predetermined number and for dividing said second phase error signal by said second predetermined number to provide first and second phase error signals proportional to the average value of said first and second predetermined numbers of digital samples respectively.

8. In a digital video signal processing system including a source of composite video signal having a chrominance signal component which includes first and second quadrature phase related color difference signal components and a color reference burst signal component having a predetermined phase relationship with respect to said first color difference signal component, a phase locked loop for developing a sampling clock signal having a frequency proportional to the frequency of said color reference burst signal and a phase relationship with respect to said color reference burst signal substantially equal to said predetermined phase relationship, and means coupled to said source and to said phase locked loop for developing digital samples representing the value of said color reference burst signal at instants determined by said sampling clock, wherein said phase locked loop includes a phase detector comprising:

first means coupled to said sample providing means and switchable between first and second operational modes for generating respective first and second phase error signals at an output terminal, said first and second phase error signals representing the values of first and second predetermined numbers of said digital samples, respectively; and second means coupled to said first means and responsive to the phase error signals provided at said output terminal for switching said first means between said first and second operational modes.

9. The phase detector set forth in claim 8 wherein:

said first means comprises an accumulator responsive to a control signal for summing said first predetermined number of digital samples when the control signal is in a first state and for summing said second predetermined number of digital samples when the control signal is in a second state; and said second means comprises:
a source of reference level signal; and
a comparator for developing said control signal being in said first state when the signal provided by said first means is greater than said reference signal and being in said second state otherwise.

10. The phase detector set forth in claim 9 wherein said first means comprises:

means responsive to said control signal for dividing said first phase error signal by said first predetermined number and for dividing said second phase error signal by said second predetermined number to provide first and second phase error signals proportional to the average value of said first and second predetermined numbers of digital samples respectively.

* * * * *